United States Patent
Chiu

(10) Patent No.: US 11,531,471 B2
(45) Date of Patent: Dec. 20, 2022

(54) MEMORY CIRCUIT AND MEMORY REPAIR METHOD THEREOF

(71) Applicant: NS POLES TECHNOLOGY CORP., Zhuhai (CN)

(72) Inventor: Chuang Lung Chiu, Zhubei (TW)

(73) Assignee: NS Poles Technology Corp., Zhuhai (CN)

( * ) Notice: Subject to any disclaimer, the term of this patent is extended or adjusted under 35 U.S.C. 154(b) by 4 days.

(21) Appl. No.: 17/226,518

(22) Filed: Apr. 9, 2021

(65) Prior Publication Data
US 2021/0349641 A1   Nov. 11, 2021

(30) Foreign Application Priority Data

May 8, 2020   (TW) .................................. 109115285

(51) Int. Cl.
  *G11C 29/44*   (2006.01)
  *G06F 3/06*   (2006.01)
  *G11C 29/00*   (2006.01)

(52) U.S. Cl.
  CPC .......... *G06F 3/0619* (2013.01); *G06F 3/0638* (2013.01); *G06F 3/0673* (2013.01); *G11C 29/70* (2013.01)

(58) Field of Classification Search
  CPC ..................................................... G06F 3/0619
  See application file for complete search history.

(56) References Cited

U.S. PATENT DOCUMENTS

| | | | | |
|---|---|---|---|---|
| 2013/0007544 A1* | 1/2013 | Nemazie | ............ | G06F 11/2094 714/E11.024 |
| 2019/0279734 A1* | 9/2019 | Kang | ..................... | G11C 29/44 |
| 2020/0327003 A1* | 10/2020 | Kang | .................. | G06F 11/1044 |
| 2022/0084621 A1* | 3/2022 | Zhang | ................ | G11C 29/4401 |

* cited by examiner

*Primary Examiner* — Min Huang
(74) *Attorney, Agent, or Firm* — Rosenberg, Klein & Lee

(57) ABSTRACT

A memory circuit includes a first memory array and a second memory array. The first memory array and the second memory array are independent. The first memory array includes a plurality of general bits and the second memory array includes a plurality of spare bits. An address of defective bit in the first memory array is stored in the second memory array, and the memory circuit repairs the defective bit by one of the spare bits according to the address.

12 Claims, 4 Drawing Sheets

MEMORY CIRCUIT AND MEMORY REPAIR METHOD THEREOF

This application claims priority of Application No. 109115285 filed in Taiwan on 8 May 2020 under 35 U.S.C. § 119; the entire contents of all of which are hereby incorporated by reference.

BACKGROUND OF THE INVENTION

Field of the Invention

The present invention relates to a memory circuit, particularly to a memory repair method of a memory circuit.

Description of the Related Art

Owing to various factors, a memory fabrication process may generate some defective bits. Refer to FIG. 1. In a conventional memory circuit 10, besides the portion of the space occupied by general bits 12, a portion of the space is configured to be occupied by spare bits 14 or 16. While the memory circuit 10 is found to have some defective bits in test, the spare bits 14 or 16 can replace the defective bits, whereby to repair the memory circuit 10 and raise the yield of memory fabrication.

The conventional memory repair method replaces a whole row or column of bits in repairing a memory circuit. However, the normal bits in the replaced row or column are wasted. As memory size is growing smaller and smaller and memory capacity is growing larger and larger, the density of a memory array is growing higher and higher. Thus, defective bits in a memory are also growing more and more. Then, a memory needs larger space to accommodate more spare rows and spare columns. If a memory is configured to have sufficient spare rows and spare columns for bit replacement, a vast area of the memory would be spent on accommodating the spare rows and spare columns. In comparison with the conventional method, the memory repair method of the present invention replaces a bit by a bit. Therefore, the present invention can perform repair more efficiently using identical or smaller size of spare memory.

SUMMARY OF THE INVENTION

One objective of the present invention is to provide a memory circuit and a memory repair method thereof.

According to one embodiment, the memory circuit of the present invention comprises a first memory and a second memory. The first memory includes a first memory array. Each row of the first memory array has a plurality of general bits, and the general bits are divided into a plurality of groups. The second memory includes a second memory array. Each row of the second memory array has a plurality of flag bits for indicating whether the plurality of groups have defective bits, a plurality of address bit sets for storing a plurality of defective bit addresses, and a plurality of spare bits for replacing the defective bits. If a flag bit has a first-state data, it indicates that a group corresponding to the flag bit has a defective bit. If the flag bit has a second-state data, it indicates that the corresponding group is free of a defective bit. The defective bit addresses are relative address of the corresponding defective bits in the plurality of groups.

According to one embodiment, the memory repair method of the abovementioned memory circuit comprises Step A: selecting a first row from a first memory array according to a first address data, wherein the first row has a plurality of general bits divided into a plurality of groups; Step B: selecting a second row from a second memory array according to the first address data, wherein the second row has a plurality flag bits for indicating whether the plurality of groups have defective bits, a plurality of address bit sets for storing defective bit addresses, and a plurality of spare bits for replacing the defective bits, and wherein the defective bit addresses are relative address of the corresponding defective bits in the plurality of groups; Step C: generating a column address according to a second address data; Step D: detecting a flag bit corresponding to the column address, and if the corresponding flag bit has a first-state data, selecting a defective bit address corresponding to the corresponding flag bit from the plurality of address bits groups; and Step E: comparing the column address with the corresponding defective bit address, and if the column address matches the corresponding defective bit address, selecting one of the plurality of spare bits to replace a defective bit corresponding to the defective bit address.

In comparison with the conventional method, the memory circuit and the memory repair method of the present invention replaces a bit by a bit. Therefore, the present invention can perform repair more efficiently in identical or smaller spare memory.

DETAILED DESCRIPTION OF THE INVENTION

Figure 1:
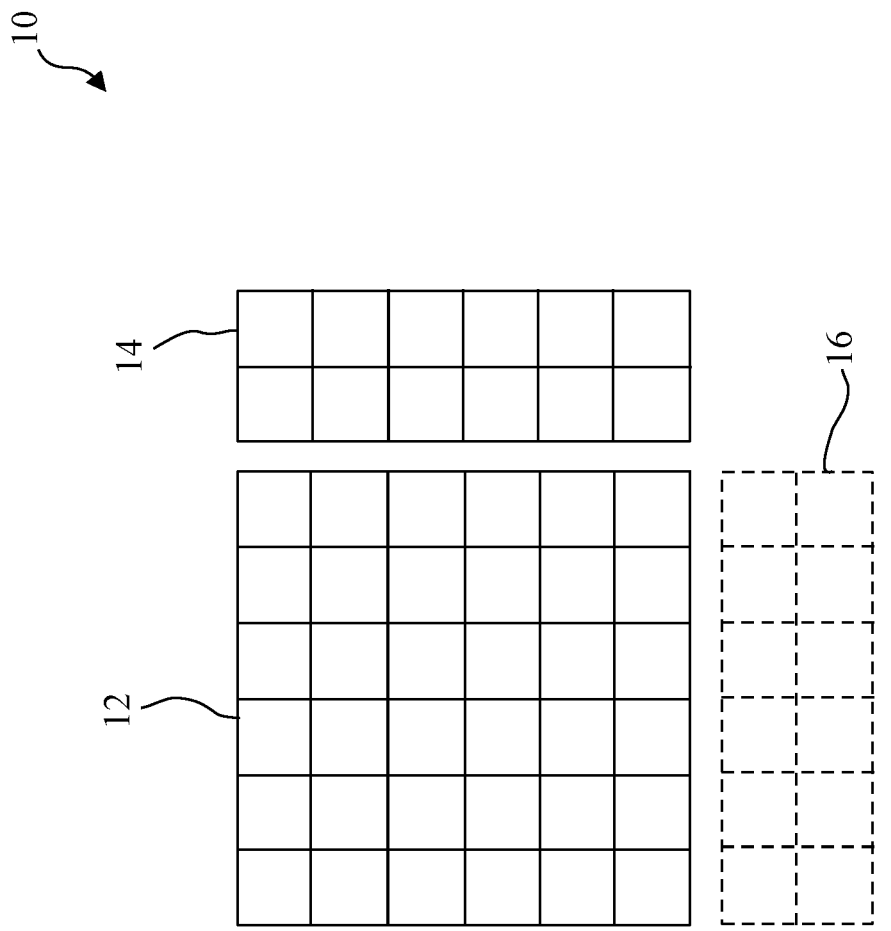
FIG. 1 shows a conventional memory circuit.
Figure 2:
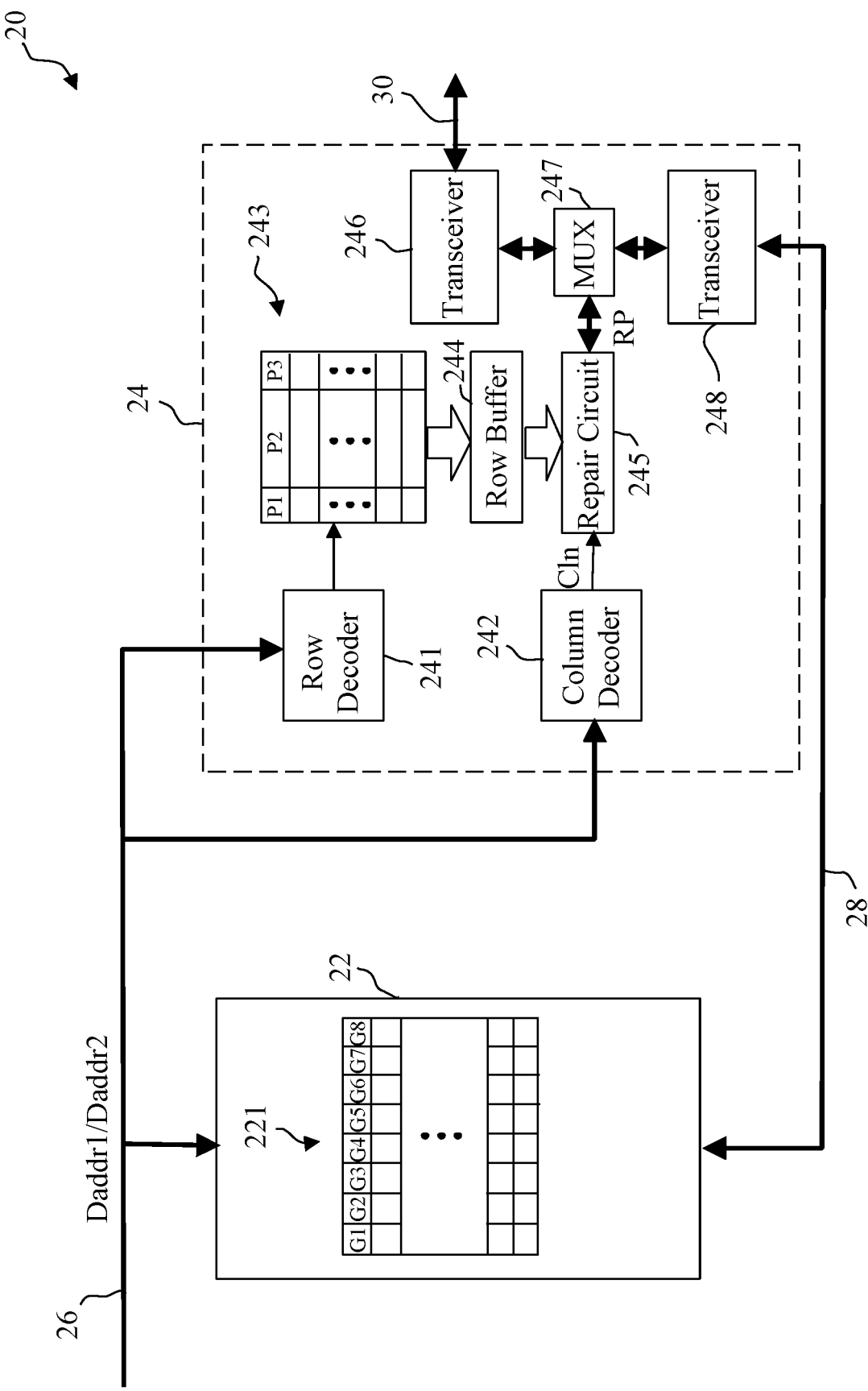
FIG. 2 shows a memory circuit according to a first embodiment of the present invention.
Figure 3:
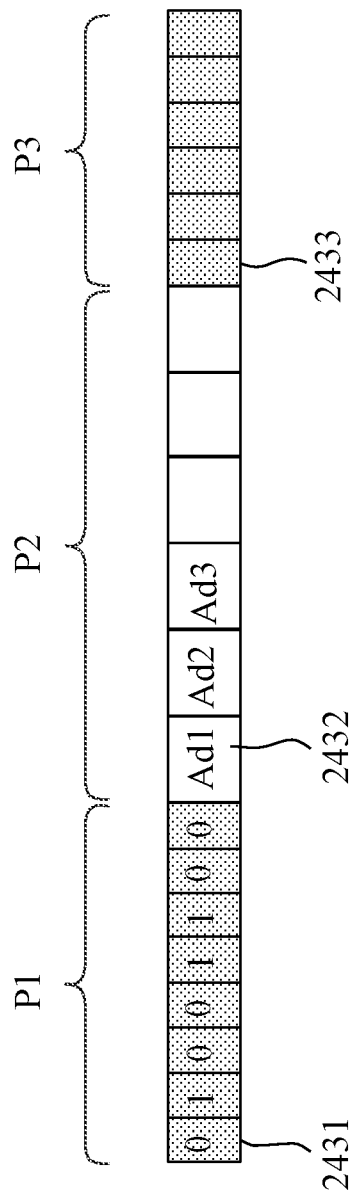
FIG. 3 shows a first embodiment of the second memory array in FIG. 2.

FIG. 2 shows a memory circuit according to a first embodiment of the present invention. The memory circuit 20 in FIG. 2 comprises a first memory 22 and a second memory 24. The first memory 22 can be but is not limited to be a dynamic random access memory (DRAM). The second memory 24 can be but is not limited to be a non-volatile memory. The first memory 22 includes a first memory array 221. Each row of the first memory array 221 has a plurality of general bits. The general bits are divided into a plurality of groups G1-G8 each having an identical number of bits. For example, each group has 128 bits. The structure and operation of the first memory 22 are the same as that of conventional DRAM and will not repeat herein. In FIG. 2, only 8 groups are depicted in each row of the first memory array 221. However, the present invention is not limited by the embodiment shown in FIG. 2. In the present invention, the number of the groups may be increased or decreased according to requirement. The second memory 24 includes a row decoder 241, a column decoder 242, a second memory array 243, a row buffer 244, a repair circuit 245, a transceiver 246, a multiplexer 247 and a transceiver 248. FIG. 3 shows a first embodiment of the second memory array 243 in FIG. 2. Each row of the second memory array 243 may be divided into three parts: P1, P2 and P3. The first part P1 has a plurality of flag bits 2431, which are used to indicate whether the plurality of groups G1-G8 of one row of the first memory array 221 have defective bits. If a group has a defective bit, the corresponding flag bit 2431 is set to have a first-state data "1". If a group does not have a defective bit, the corresponding flag bit 2431 is set to have a second-state data "0". The second part P2 has a plurality of address bit sets 2432, which are used to store a plurality of defective bit addresses Ad1-Ad3 of the defective bits in the groups G1-G8. The defective bit addresses Ad1-Ad3 are relative addresses of the defective bits in the groups G1-G8. The number of the bits in each address bit sets correlates with the number of the bits in each group of the first memory array 221. For example, if a group has 128 bits, each address bit set has 7 bits to form the defective bit address. When the first bit in a group is a defective bit, the defective bit address thereof is "0000000". When the second bit in a group is a defective bit, the defective bit address thereof is "0000001". The other defective bit addresses are also generated similarly. The third Part 3 has a plurality of spare bits 2433, which are used to replace defective bits. In one embodiment, the first memory 22 and the second memory 24 may be in an identical package. In one embodiment, the first memory 22 and the second memory 24 may be integrated to a system-on-a-chip (SOC).

Refer to FIG. 2 and FIG. 3. While an address bus 26 provides a first address data Daddr1, the first memory 22 selects one row (called the first row thereinafter) from the first memory array 221 according to the first address data Daddr1 and couples the first row to a multiplexer 247 via a data bus 28 and the transceiver 248, whereby to facilitate the succeeding access operation. The first address data Daddr1 is also provided to the second memory 24. According to the first address data Daddr1, the row decoder 241 in the second memory 24 couples one row (called the second row thereinafter) of the second memory array 243 to the row buffer 244. Next, the address bus 26 further provides a second address data Daddr2 to the first memory 22 and the second memory 24. According to the second address data Daddr2, the first memory 22 selects a byte which data are to be read from or written into, from the first row, wherein a byte has 8 general bits. According to the second address data Daddr2, the column decoder 242 of the second memory 24 generates at least one column address Cln. Each column address Cln is corresponding to one byte in the first row. According to the at least one column address Cln, the repair circuit 245 finds out the corresponding flag bits 2431. Next, according to an order of the flag bits 2431 having the first-state data "1", the repair circuit 245 obtains corresponding defective bit addresses Ad1, Ad2 or Ad3 from the plurality of address bit sets 2432, whereby to determine whether to repair the general bits in the bytes corresponding to the at least one column address Cln. In detail, while the byte corresponding to one column address Cln is in the first group G1, the repair circuit 245 will acquire the second-state data "0" from the first flag bit 2431 in the second row, as shown in FIG. 3. Thus, the repair circuit 245 determines that the bits in the byte corresponding to the column address Cln are all normal bits and needn't be repaired. The host (not shown in the drawings) may read data from the byte corresponding to the column address Cln through a bus 30 and the multiplexer 247. Alternatively, the host may write data into the byte corresponding to the column address Cln through the bus 30 and the multiplexer 247. While the byte corresponding to a column address Cln is in the second group G2, the repair circuit 245 will obtain the first-state data "1" from the second flag bit 2431 of the second row. As the second flag bit 2431 is the first flag bit having the first-state data "1", the repair circuit 245 selects the defective bit address Ad1 of the first address bit set 2342 to determine the defective bit of the second group G2. The repair circuit 245 compares the column address Cln with the defective bit address Ad1; if both do not match, it indicates that the bits in the byte corresponding to the column address Cln are all normal bits, and repair operation is unnecessary; if both match, it indicates that a defective bit exists in the byte corresponding to the column address Cln, and the repair circuit 245 generates a repair data RP to the multiplexer 247. According to the repair data, the multiplexer 247 selects one spare bit 2433 from the second row to replace the defective bit corresponding to the defective bit address Ad1. Therefore, through the bus 30, the transceiver 247, the multiplexer 247, the transceiver 248 and the bus 28, the host can read data from the normal bit of the corresponding byte and the selected spare bit 2433 or write data into the normal bit of the corresponding byte and the selected spare bit 2433._While the byte corresponding to a column address Cln is in the fifth group G5, the repair circuit 245 will obtain a first-state data "1" from the fifth flag bit 2431. As the fifth flag bit 2431 is the second flag bit having the first-state data "1", the repair circuit 245 selects the defective bit address Ad2 of the second address bit set 2342 to determine whether the corresponding byte has a defective bit, and performs the above-mentioned operations according to the determination result. While the byte corresponding to a column address Cln is in the sixth group G6, the repair circuit 245 will obtain the first-state data "1" from the sixth flag bit 2431. As the sixth flag bit 2431 is the third flag bit having the first-state data "1", the repair circuit 245 selects the defective bit address Ad3 of the third address bit set 2342 to determine whether the corresponding byte has a defective bit, and performs the abovementioned operations according to the determination result. In the embodiment shown in FIG. 3, while a spare bit 2433 is selected to replace a defective bit, the order of the flag bit having the first-state data "1" is used to determine the selected spare bit 2433. For example, as the fifth flag bit 2431 is the second flag bit having the first-state data "1", the second spare bit of the plurality of spare bits 2433 is selected to replace the defective bit.

In one embodiment, the repair circuit 245 may use a counter (not shown in the drawings) to count the times that the first-state data "1" appear so as to record the order thereof. Suppose that the initial value of the counted values is 0 and that the second flag bit 2431 is detected to have the first-state data "1". As the counted value is 0, the repair circuit 245 determines that the second flag bit 2431 is the first flag bit having the first-state data "1". Thus, the repair circuit 245 selects the defective bit address Ad1 of the first address bit set 2432 and changes the counted value to 1. Next, the fifth flag bit 2431 is detected to have the first-state data "1". As the counted value is 1, the repair circuit 245 determines that the first-state data "1" is the second first-state data "1". Thus, the repair circuit 245 selects the defective bit address Ad2 of the second address bit set 2432 and changes the counted value to 2. Next, the sixth flag bit 2431 is detected to have the first-state data "1". As the counted value is 2, the repair circuit 245 determines that the first-state data "1" is the third first-state data "1". Thus, the repair circuit 245 selects the defective bit address Ad3 of the third address bit set 2432 and changes the counted value to 3.

Figure 4:
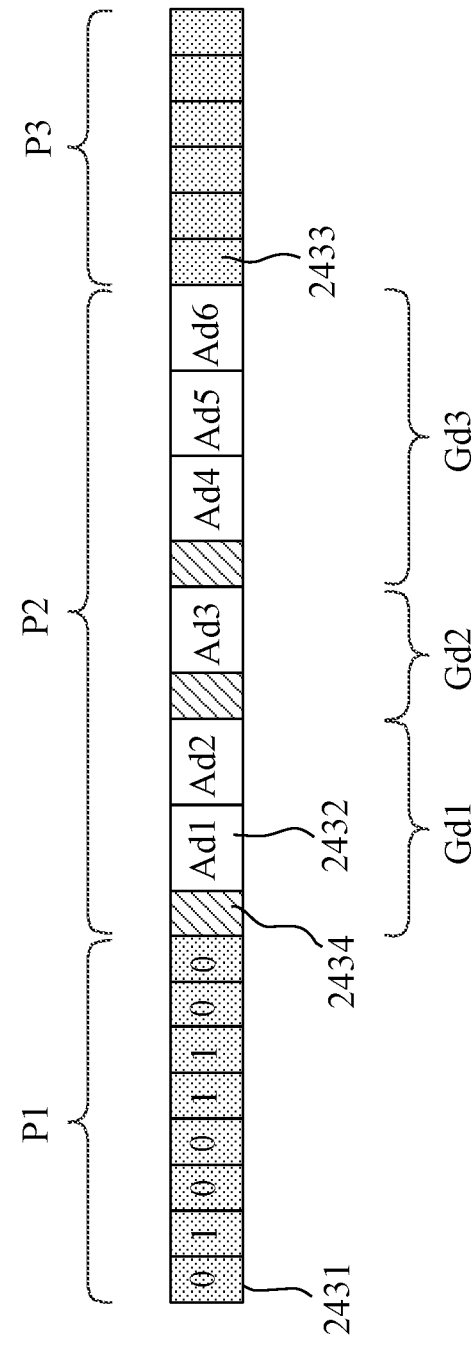
FIG. 4 shows a second embodiment of the second memory array in FIG. 2.

FIG. 4 shows a second embodiment of the second memory array 243 in FIG. 2. The embodiment in FIG. 4 is different from the embodiment in FIG. 3 in that the plurality of address bit sets of the second part P2 is divided into a plurality of address groups Gd1, Gd2 and Gd3. Each of the address groups Gd1, Gd2 and Gd3 has a partition label 2434 and at least one address bit set 2432. Refer to FIG. 2 and FIG. 4. According to at least one column address Cln, the repair circuit 245 finds out the corresponding flag bit 2432. According to the order of the flag bit having the first-state data "1", the repair circuit 245 acquires the corresponding defective bit address from the plurality of address groups Gd1, Gd2 and Gd3. In FIG. 4, as the second flag bit 2431 is the first flag bit having the first-state data "1", the repair circuit 245 selects the first address group Gd1 to acquire the defective bit addresses Ad1 and Ad2. The address group Gd1 has two address bit sets 2432, which indicates that the corresponding second group G2 has two defective bits. As the fifth flag bit 2431 is the second flag bit having the first-state data "1", the repair circuit 245 selects the second address group Gd2 to acquire the defective bit address Ad3. The address group Gd2 has only an address bit set 2432, which indicates that the corresponding fifth group G5 has only a defective bit. As the sixth flag bit 2431 is the third flag bit having the first-state data "1", the repair circuit 245 selects the third address group Gd3 to acquire the defective bit addresses Ad4, Ad5 and Ad6. The address group Gd3 has three address bit sets 2432, which indicates that the corresponding sixth group G6 has three defective bits. In detail, while the byte corresponding to a column address Cln is in the second group G2, the repair circuit 245 will acquire the first-state data "1" from the second flag bit 2431. As the second flag bit 2431 is the first flag bit having the first-state data "1", the repair circuit 245 selects the first address group Gd1 to acquire the defective bit addresses Ad1 and Ad2. The repair circuit 245 compares the column address Cln with the defective bit addresses Ad1 and Ad2. If the column address Cln neither matches the defective bit address Ad1 nor matches the defective bit address Ad2, it indicates that the bits of the byte corresponding to the column address Cln are all normal bits. The host can read data from or write data into all the general bits of the byte. If the column address Cln matches one of the defective bit addresses Ad1 and Ad2, it indicates that the byte corresponding to the column address has a defective bit. The repair circuit 245 will generate a repair data RP to the multiplexer 247. According to the repair data RP, the multiplexer 247 uses one of the spare bits 2433 to replace the bit corresponding to the defective bit address Ad1 or Ad2. The host can read data from or write data into the normal bits of the byte and the selected spare bit 2433.

Figure 5:
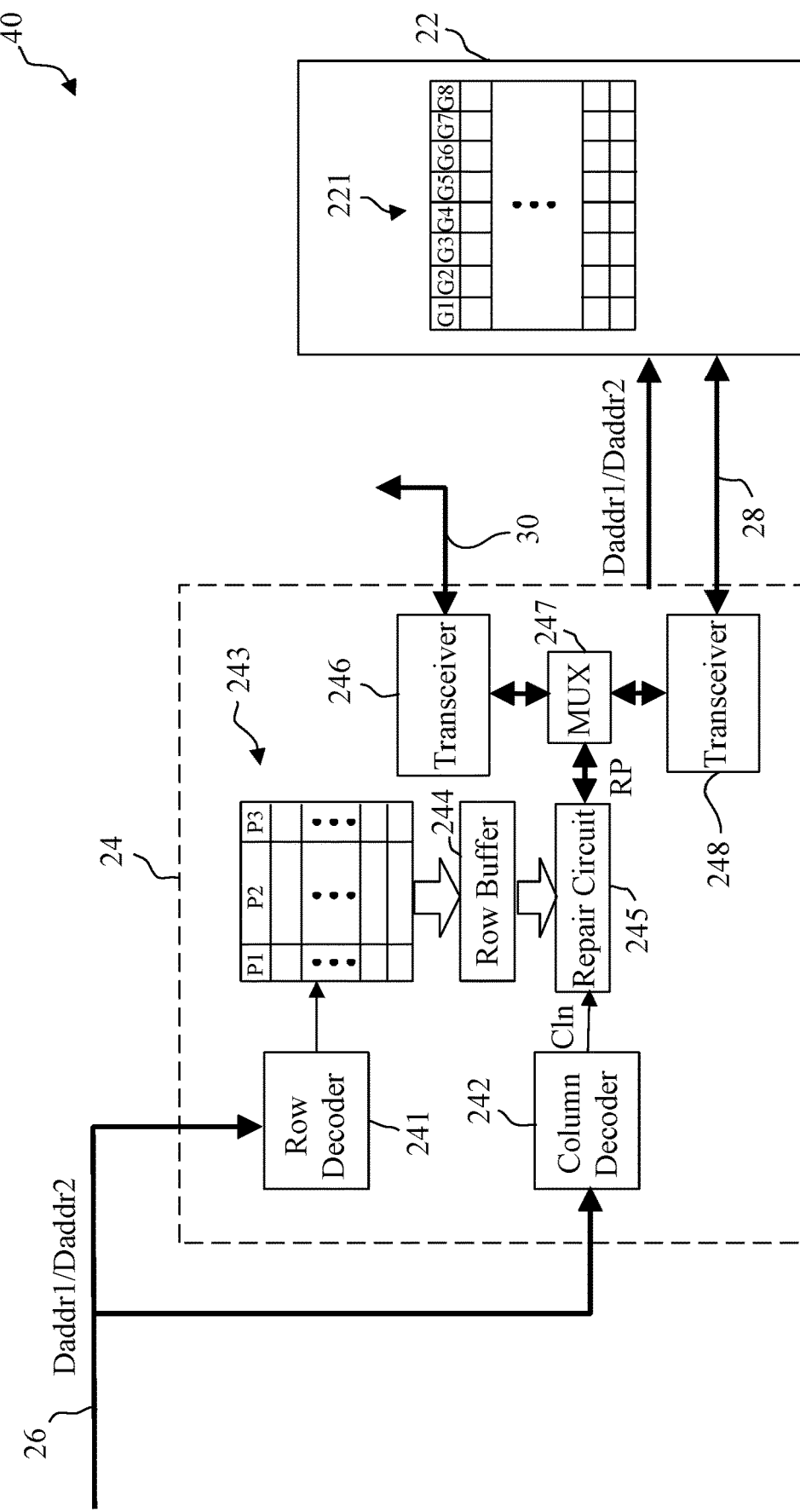
FIG. 5 shows a memory circuit according to a second embodiment of the present invention.

FIG. 5 shows a memory circuit according to a second embodiment of the present invention. Similar to the memory circuit 20 in FIG. 2, the memory circuit 40 in FIG. 5 also comprises a first memory 22 and a second memory 24. The second memory 24 also includes a row decoder 241, a column decoder 242, a second memory array 243, a row buffer 244, a repair circuit 245, a transceiver 246, a multiplexer 247 and a transceiver 248. The operation of the memory circuit 40 is the same as the operation of the memory circuit 20. The difference between the memory circuit 40 in FIG. 5 and the memory circuit 20 in FIG. 2 is as follows: the first memory 22 and the second memory 24 in FIG. 2 simultaneously receive the first address data Daddr1 or the second address data Daddr2; in the memory circuit 40 of FIG. 5, the first address data Daddr1 is transmitted to the second memory 24, and the second memory 24 transmits the first address data Daddr1 to the first memory 22; next, the second address data Daddr2 is transmitted to the second memory 24, and the second memory 24 transmits the second address data Daddr2 to the first memory 22.

The embodiments have been described above to demonstrate the principles of the present invention and enable the persons skilled in the art to understand, make, and use the present invention. However, these embodiments are only to exemplify the present invention but not to limit the scope of the present invention. The technical thought and scope of the present invention is defined by the claims stated below and the equivalents thereof. Any modification or variation according to the principle, spirit or embodiment of the present invention is to be also included by the scope of the present invention.

What is claimed is:

1. A memory repair method, comprising:
   (A) selecting a first row from a first memory array according to a first address data, wherein said first row has a plurality of general bits divided into a plurality of groups;
   (B) selecting a second row from a second memory array according to said first address data, wherein said second row has a plurality of flag bits for indicating whether said plurality of groups have defective bits, a plurality of address bit sets for storing a plurality of defective bit addresses, and a plurality of spare bits for replacing said defective bits, and wherein said plurality of defective bit addresses are relative addresses of said defective bits in said plurality of groups;
   (C) generating a column address according to a second address data;
   (D) detecting a flag bit corresponding to said column address, and obtaining a corresponding defective bit address from said plurality of address bit sets if said corresponding flag bit has a first-state data; and
   (E) selecting one of said plurality of spare bits to replace a defective bit corresponding to said corresponding defective bit address.

2. The memory repair method according to claim 1, wherein said step D comprises obtaining said corresponding defective bit address from said plurality of address bit sets according to an order of said corresponding flag bit in flag bits having said first-state data.

3. The memory repair method according to claim 1, wherein said step D comprises:
   dividing said plurality of address bit sets into a plurality of address groups, wherein each of said plurality of address groups has at least one said address bit set;
   selecting one of said plurality of address groups according to an order of said corresponding flag bit in flag bits having said first-state data; and
   acquiring said corresponding defective bit address from said selected address group.

4. The memory repair method according to claim 1, wherein said step E comprises while said column address matches said corresponding defective bit address, selecting one of said plurality of spare bits to replace said corresponding defective bit according to an order of said corresponding flag bit in flag bits having said first-state data.

5. A memory circuit, comprising:
   a first memory, including a first memory array, wherein each row of said first memory array has a plurality of general bits divided into a plurality of groups; and
   a second memory, including a second memory array, wherein each row of said second memory array has a plurality of flag bits for indicating whether said plurality of groups have defective bits, a plurality address bit sets for storing a plurality of defective bit addresses, and a plurality of spare bits for replacing said defective bits;

wherein if a flag bit has a first-state data, it indicates that a corresponding group has a defective bit, and if said flag bit has a second-state data, it indicates that said corresponding group is free of a defective bit;

wherein said plurality of defective bit addresses are relative addresses of said defective bits in said plurality of groups.

6. The memory circuit according to claim 5, wherein said second memory further comprises:

a row buffer;

a row decoder, connected with said second memory array and said row buffer, configured to select a row from said second memory array according to a first address data and couple said row to said row buffer;

a column decoder, generating a column address according to a second address data;

a repair circuit, connected with said row buffer and said column decoder, configured to compare said column address with an acquired defective bit address, wherein if said column matches said acquired defective bit address, said repair circuit generates a repair data; and a multiplexer, connected with said first memory and said repair circuit, selecting one of said plurality of spare bits according to said repair data to replace a defective bit corresponding to said acquired defective bit address.

7. The memory circuit according to claim 6, wherein said repair circuit obtain said acquired defective bit address from said plurality of address bit sets according to an order of flag bits having said first-state data.

8. The memory circuit according to claim 6, wherein said plurality of address bit sets are divided into a plurality of address groups; each of said plurality of address groups includes at least one said address bit set; said repair circuit selects one of said plurality of address groups to obtain said acquired defective bit address according to an order of flag bits having said first-state data.

9. The memory circuit according to claim 6, wherein said first memory and said second memory are in a package.

10. The memory circuit according to claim 6, wherein said first memory and said second memory are integrated to a system-on-a-chip (SOC).

11. The memory circuit according to claim 6, wherein said first memory and said second memory simultaneously receive said first address data or said second address data.

12. The memory circuit according to claim 6, wherein said second memory transmits said first address data and said second address data to said first memory.

* * * * *